United States Patent
Nezuka et al.

(10) Patent No.: US 11,815,531 B2
(45) Date of Patent: *Nov. 14, 2023

(54) CURRENT SENSOR

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Tomohiro Nezuka, Nisshin (JP); Yoshikazu Furuta, Nisshin (JP); Shotaro Wada, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/875,677

(22) Filed: Jul. 28, 2022

(65) Prior Publication Data
US 2023/0054772 A1 Feb. 23, 2023

(30) Foreign Application Priority Data
Aug. 17, 2021 (JP) ................. 2021-132747

(51) Int. Cl.
*G01R 31/00* (2006.01)
*G01R 15/14* (2006.01)
(Continued)

(52) U.S. Cl.
CPC .......... *G01R 15/146* (2013.01); *G01R 1/071* (2013.01); *G01R 15/242* (2013.01);
(Continued)

(58) Field of Classification Search
CPC .... G01R 15/146; G01R 27/02; G01R 35/005; G01R 1/203; G01R 15/246; G01R 15/242;
(Continued)

(56) References Cited

U.S. PATENT DOCUMENTS 6,909,275 B2 6/2005 Hartzsch
8,779,777 B2 7/2014 Irmer et al.
(Continued)

FOREIGN PATENT DOCUMENTS

DE 103 10 503 A1 9/2004
JP S62-168049 A 7/1987

OTHER PUBLICATIONS

Office Action dated Aug. 8, 2023 issued in related U.S. Appl. No. 17/875,547.

*Primary Examiner* — Raul J Rios Russo
(74) *Attorney, Agent, or Firm* — POSZ LAW GROUP, PLC

(57) ABSTRACT

A current sensor of a detection target current using a shunt resistor includes: a resistance value correction circuit having: a correction resistor; a signal application unit that applies an alternating current signal to a series circuit of the shunt resistor and the correction resistor; a first voltage detection unit that detects the terminal voltage of the shunt resistor; a second voltage detection unit that detects a terminal voltage of the correction resistor; and a correction unit that calculates the resistance value of the shunt resistor based on a first voltage detection value by the first voltage detection unit and a second voltage detection value by the second voltage detection unit, and corrects the resistance value for current detection based on a calculated resistance value of the shunt resistor.

7 Claims, 15 Drawing Sheets

(51) Int. Cl.
*G01R 27/02* (2006.01)
*G01R 15/24* (2006.01)
*G01R 1/07* (2006.01)
*H02S 50/10* (2014.01)
*H02S 50/00* (2014.01)
*H02S 50/15* (2014.01)

(52) U.S. Cl.
CPC ............ *G01R 15/246* (2013.01); *G01R 27/02* (2013.01); *H02S 50/00* (2013.01); *H02S 50/10* (2014.12); *H02S 50/15* (2014.12)

(58) Field of Classification Search
CPC ......... G01R 1/071; H02S 50/10; H02S 50/00; H02S 50/15
USPC ............................... 324/72, 76.11–76.83, 96
See application file for complete search history.

(56) References Cited

U.S. PATENT DOCUMENTS

| | | | |
|---|---|---|---|
| 8,947,101 B2 | 2/2015 | Engl | |
| 9,632,163 B2 | 4/2017 | Mueller et al. | |
| 10,473,724 B2 | 11/2019 | Aumer et al. | |
| 2013/0009655 A1* | 1/2013 | Marten | G01R 19/0092 |
| | | | 324/713 |
| 2015/0268277 A1* | 9/2015 | Marten | G01R 29/24 |
| | | | 324/123 R |
| 2017/0003322 A1* | 1/2017 | Nakamura | G01R 15/146 |
| 2017/0089955 A1* | 3/2017 | Yugou | B60L 3/0038 |
| 2023/0055691 A1* | 2/2023 | Nezuka | G01R 19/0092 |

* cited by examiner

CURRENT SENSOR

CROSS REFERENCE TO RELATED APPLICATIONS

The present application claims the benefit of priority from Japanese Patent Application No. 2021-132747 filed on Aug. 17, 2021. The entire disclosure of the above application is incorporated herein by reference.

TECHNICAL FIELD

The present disclosure relates to a current sensor that detects a detection target current by using a shunt resistor.

BACKGROUND

In the conceivable current sensor, the terminal voltage of the shunt resistor provided in series with the path through which the detection target current flows is measured, and the current as thee detection target is calculated based on the measured voltage and the resistance value for current detection corresponding to the resistance value of the shunt resistor. In this case, since the resistance value of the shunt resistor may change due to deterioration over time or the like, it may be necessary to correct the resistance value for current detection used for calculating the current at any time. In the following description, the conceivable current sensor according to a first technique will be referred to as a first conceivable technique, and the conceivable current sensor according to a second technique will be referred to as a second conceivable technique.

In the first conceivable technique, the resistance value for current detection is corrected as follows. That is, the first conceivable technique provides a sub-resistor provided so that a detection target current flows in the sub-resistor, similar to the shunt resistor in a normal state, and a correction resistor provided so that a detection target current does not flow in the correction resistor in a normal time. According to the above configuration, the sub-resistor deteriorates with time similar to the shunt resistor, but the correction resistor hardly deteriorates with time. In the first conceivable technique, the degree of deterioration of the sub-resistor and the shunt resistor is obtained by comparing the resistance value of the sub-resistor and the correction resistor at the time of correction, and the resistance value for current detection is corrected based on the deterioration degree.

In the second conceivable technique, the resistance value for current detection is corrected as follows. That is, the second conceivable technique has a configuration in which a plurality of shunt resistors are provided and a correction current is passed from the interconnection nodes of the plurality of shunt resistors, or an input terminal is provided in the central portion of the shunt resistor and a correction current is passed from the input terminal. In the second conceivable technique, the terminal voltage of each resistor when a correction current is passed is measured, and the individual resistance value is calculated based on the measurement result to correct the resistance value for current detection.

SUMMARY

According to an example, a current sensor of a detection target current using a shunt resistor includes: a resistance value correction circuit having: a correction resistor; a signal application unit that applies an alternating current signal to a series circuit of the shunt resistor and the correction resistor; a first voltage detection unit that detects the terminal voltage of the shunt resistor; a second voltage detection unit that detects a terminal voltage of the correction resistor; and a correction unit that calculates the resistance value of the shunt resistor based on a first voltage detection value by the first voltage detection unit and a second voltage detection value by the second voltage detection unit, and corrects the resistance value for current detection based on a calculated resistance value of the shunt resistor.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
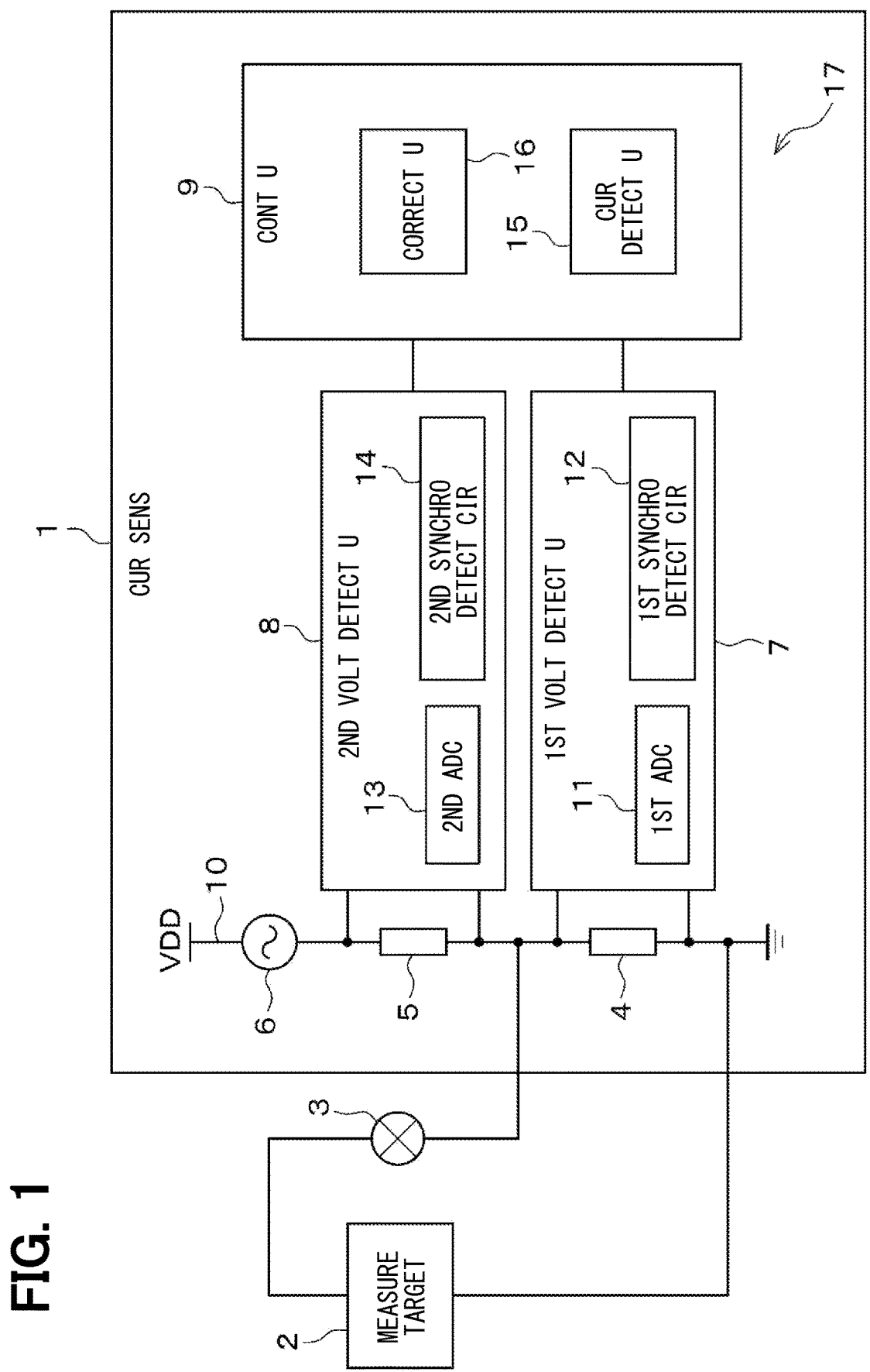
FIG. 1 is a diagram schematically showing a configuration of a current sensor according to a first embodiment.

In the first conceivable technique, the shunt resistor is not used for direct correction, and it is assumed that the sub-resistor deteriorates in the same manner as the shunt resistor, and then the sub-resistor is used to indirectly correct the resistance value for the current detection corresponding to the resistance value of the shunt resistor. Therefore, in the first conceivable technique, if the above assumption is not satisfied, the resistance value for current detection may not be corrected with high accuracy, and as a result, the current detection accuracy may decrease.

In the second conceivable technique, since it is necessary to provide a plurality of shunt resistors or to provide an input terminal in the central portion of the shunt resistor, there arises a difficulty that the configuration becomes complicated. Further, in the second conceivable technique, it is difficult to sufficiently improve the accuracy of the correction because the accuracy of the correction of the resistance value for current detection greatly depends on the accuracy of the correction current.

The present embodiments have been made in view of the above circumstances, and an object of the present embodiments is to provide a current sensor capable of accurately correcting a resistance value for current detection without incurring a complicated configuration.

A current sensor detects a detection target current based on a terminal voltage of a shunt resistor provided in series in a path through which the detection target current flows and a resistance value for current detection corresponding to a resistance value of the shunt resistor. The current sensor includes a resistance value correction circuit for correcting the resistance value for current detection. The resistance value correction circuit includes a correction resistor, a signal application unit, a first voltage detection unit, a second voltage detection unit, and a correction unit. The correction resistor is connected in series together with the shunt resistor in a path different from the path through which the detection target current flows, and the resistance accuracy thereof is higher than that of the shunt resistor.

The signal application unit applies an AC signal to the series circuit of the shunt resistor and the correction resistor. The first voltage detection unit detects the terminal voltage of the shunt resistor when the AC signal is applied to the series circuit. The second voltage detection unit detects the terminal voltage of the correction resistor when the AC signal is applied to the series circuit. The correction unit calculates the resistance value of the shunt resistor based on the first voltage detection value which is the terminal voltage detection value by the first voltage detection unit and the second voltage detection value which is the terminal voltage detection value by the second voltage detection unit, and corrects the resistance value for detection based on the calculated resistance value which is the calculated resistance value of the shunt resistor.

According to such a configuration, it is possible to directly correct the resistance value for detection by using the shunt resistor without indirectly correcting the resistance value for detection by using the sub-resistors as in the first conceivable technique. Further, according to the above configuration, unlike the second conceivable technique, it is not necessary to provide a plurality of shunt resistors nor to provide an input terminal at the center of the shunt resistors, and only one shunt resistor needs to be provided, so that the configuration of the entire current sensor is not complicated.

Further, according to the above configuration, the calculation accuracy of the calculated resistance value and the correction accuracy of the resistance value for detection greatly depend on the accuracy of the resistance value of the correction resistor and the detection accuracy of the first voltage detection value and the second voltage detection value. In this case, since the correction resistor has a higher resistance accuracy than the shunt resistor, the correction accuracy of the resistance value for detection is sufficiently improved. Therefore, according to the above configuration, it is possible to obtain an excellent effect that the resistance value for detection can be corrected with high accuracy without complicating the configuration of the entire current sensor.

Hereinafter, multiple embodiments will be described with reference to the drawings. In each embodiment, the substantially same components are denoted by the same reference numerals and description thereof will be omitted.

First Embodiment

The first embodiment of the present disclosure is described with reference to FIGS. 1 to 6.

(General Configuration)

The current sensor 1 of the present embodiment shown in FIG. 1 is mounted on a vehicle such as an automobile, and detects a detection target current which is a current flowing through the measurement target 2. The measurement target 2 may be a battery such as a main engine battery that supplies electric power to a drive unit for traveling a vehicle, an auxiliary battery that supplies electric power to an auxiliary device of the vehicle, a DC/DC converter, and the like. The DC/DC converter supplies electric power to a motor that generates a driving force for driving a vehicle, and constitutes the above-mentioned driving unit together with the motor.

In this case, the load 3 is connected in series to the measurement target 2, and the loop circuit is configured by the measurement target 2, the load 3, a switch (not shown), and the like. When the measurement target 2 is the above-mentioned battery, the load 3 may be, for example, the above-mentioned motor, the above-mentioned DC/DC converter, the electric compressor, or the like. Further, when the measurement target 2 is the above-mentioned DC/DC converter, the load 3 may be, for example, the above-mentioned motor or the like.

The current sensor 1 includes a shunt resistor 4, a correction resistor 5, a signal application unit 6, a first voltage detection unit 7, a second voltage detection unit 8, and a control unit 9. One terminal of the shunt resistor 4 is connected to the high potential side terminal of the measurement target 2 via the load 3, and the other terminal is connected to the ground which is the reference potential of the circuit and the low potential side terminal of the measurement target 2. That is, the shunt resistor 4 is provided in series with the path through which the detection target current flows. The current sensor 1 detects the detection target current using the terminal voltage of the shunt resistor 4 provided in this way and the resistance value for detection corresponding to the resistance value of the shunt resistor 4.

One terminal of the correction resistor 5 is connected to the signal application unit 6, and the other terminal is connected to the one terminal of the shunt resistor 4. That is, the correction resistor 5 is connected in series with the shunt resistor 4 in a path different from the path through which the detection target current flows. In this case, since the detection target current is a relatively large current, the resistance value of the shunt resistor 4 is a relatively small value, for example, on the order of $\mu\Omega$.

On the other hand, since a relatively large detection target current does not flow through the correction resistor 5, its resistance values are relatively large, for example, on the order of $m\Omega$. In general, it may be difficult to accurately form a resistor having a small resistance value, but it may be relatively easy to accurately form a resistor having a large resistance value. Therefore, in the present embodiment, the resistance accuracy of the correction resistor 5 is sufficiently higher than the resistance accuracy of the shunt resistor 4.

The signal application unit 6 applies a pulse wave or sinusoidal AC signal to the series circuit of the shunt resistor 4 and the correction resistor 5 at the time of correction when the resistance value for detection described later is corrected. In other words, the signal application unit 6 applies the same AC signal to the shunt resistor 4 and the correction resistor 5 at the time of correction. In this case, the signal application unit 6 is configured as a current source for supplying an alternating current to the series circuit from the power supply line 10 to which the power supply voltage VDD of +5 V is supplied, for example. The first voltage detection unit 7 detects the terminal voltage of the shunt resistor 4 when an AC signal is applied to the series circuit of the shunt resistor 4 and the correction resistor 5, and includes the first A/D converter 11 and the first synchronous detection circuit 12. In drawings such as FIG. 1, the A/D converter is abbreviated as ADC.

The first A/D converter 11 performs the following A/D conversion operation in order to detect the terminal voltage of the shunt resistor 4. That is, the first A/D converter 11 inputs the signal of each terminal of the shunt resistor 4, and by performing A/D conversion of each signal, outputs the difference in the voltage of each terminal of the shunt resistor 4, that is, the digital signal corresponding to the inter-terminal voltage of the shunt resistor 4. The digital signal output from the first A/D converter 11 in this way is a signal corresponding to the signal of the terminal of the shunt resistor 4.

The first synchronous detection circuit 12 inputs a digital signal output from the first A/D converter 11 and synchronously detects the signal at the same frequency as the AC signal in the signal application unit 6, and extracts the signal. Then, the first synchronous detection circuit 12 outputs the extracted signal to the control unit 9. The output signal of the first synchronous detection circuit 12 is a signal corresponding to the terminal voltage of the shunt resistor 4. In this way, during the correction period, the first voltage detection unit 7 is configured to detect the terminal voltage of the shunt resistor 4 based on the output signal of the first synchronous detection circuit 12, and outputs the signal representing the detection value of the terminal voltage as the first voltage detection value to the control unit 9.

The first voltage detection unit 7 detects the terminal voltage of the shunt resistor 4 as follows when the AC signal is not applied to the series circuit of the shunt resistor 4 and the correction resistor 5, that is, in the normal state. That is, in the normal state, the first A/D converter 11 performs the A/D conversion operation in the same manner as in the correction time. In this case, the digital signal output from the first A/D converter 11 is output to the control unit 9 without being input to the first synchronous detection circuit 12. That is, in the normal state, the first voltage detection unit 7 detects the terminal voltage of the shunt resistor 4 based on the output signal of the first A/D converter 11, and outputs a signal representing the detection value of the terminal voltage as the first voltage detection value to the control unit 9.

The second voltage detection unit 8 detects the terminal voltage of the correction resistor 5 when an AC signal is applied to the series circuit of the shunt resistor 4 and the correction resistor 5, and includes the second A/D converter 13 and the second synchronous detection circuit 14. The second A/D converter 13 performs an A/D conversion operation as follows in order to detect the terminal voltage of the correction resistor 5. That is, the second A/D converter 13 inputs the signal of each terminal of the correction resistor 5, and by performing A/D conversion of each signal, outputs the difference in the voltage of each terminal of the correction resistor 5, that is, a digital signal corresponding to the inter-terminal voltage of the correction resistor 5. The digital signal output from the second A/D converter 13 in this way is a signal corresponding to the signal of the terminal of the correction resistor 5.

The second synchronous detection circuit 14 inputs a digital signal output from the second A/D converter 13 and synchronously detects the signal at the same frequency as the AC signal in the signal application unit 6, and extracts the signal. Then, the second synchronous detection circuit 14 outputs the extracted signal to the control unit 9. The output signal of the second synchronous detection circuit 14 is a signal corresponding to the terminal voltage of the correction resistor 5. In this way, during the correction period, the second voltage detection unit 8 is configured to detect the terminal voltage of the correction resistor 5 based on the output signal of the second synchronous detection circuit 14, and outputs the signal representing the detection value of the terminal voltage as the second voltage detection value to the control unit 9.

The control unit 9 is configured as a semiconductor integrated circuit such as the same ASIC together with the first voltage detection unit 7 and the second voltage detection unit 8. ASIC is an abbreviation for Application Specific Integrated Circuit. The control unit 9 includes functional blocks such as a current detection unit 15 and a correction unit 16. Each of these functional blocks is realized by hardware. The control unit 9 can be configured as a semiconductor integrated circuit different from the first voltage detection unit 7 and the second voltage detection unit 8. For example, the control unit 9 may be configured by a microcomputer including a CPU, a RAM, a ROM, and the like. In this case, each of the above-mentioned functional blocks is realized by the CPU of the control unit 9 executing a computer program stored in a ROM or the like to provide a process corresponding to the computer program, that is, realized by software. Alternatively, in this case, at least a part of the functional blocks of the parking lot server device may be implemented in hardware manner.

The current detection unit 15 detect a detection target current using a signal corresponding to the terminal voltage of the shunt resistor 4 output from the first voltage detection unit 7 at the normal time and a resistance value for detection corresponding to the resistance value of the shunt resistor 4. The resistance value for detection is set based on the initial resistance value of the shunt resistor 4 actually used, and is stored in advance in the memory provided in the control unit 9. Here, since the detection target current, which is a relatively large current, flows in the shunt resistor 4, the resistance value changes from the initial value due to deterioration over time or the like.

Therefore, the above-mentioned resistance value for detection is corrected at any time by the operation of the correction unit 16. At the time of correction, the correction unit 16 calculates the resistance value of the shunt resistor 4 based on the corrected resistance value corresponding to the resistance value of the correction resistor 5, the signal representing a first voltage detection value output from the first voltage detection unit 7, and the signal representing a second voltage detection value output from the second voltage detection unit 8. The correction unit 16 corrects the resistance value for detection based on the calculated resistance value which is the calculated resistance value of the shunt resistor 4. For example, the correction unit 16 can correct the resistance value for detection so as to match the calculated resistance value.

The above-mentioned correction resistor value is an initial resistance value of the correction resistor 5 actually used, and is stored in advance in the memory provided in the control unit 9. Since the detection target current does not flow in the correction resistor 5 in the normal state, the resistance value hardly changes from the initial value due to aged deterioration or the like. As described above, in the above configuration, the resistance value correction circuit 17 for correcting the resistance value for detection is configured by the correction resistor 5, the signal application unit 6, the first voltage detection unit 7, the second voltage detection unit 8, and the correction unit 16.

<Specific Configuration of Signal Application Unit>

Figure 2:
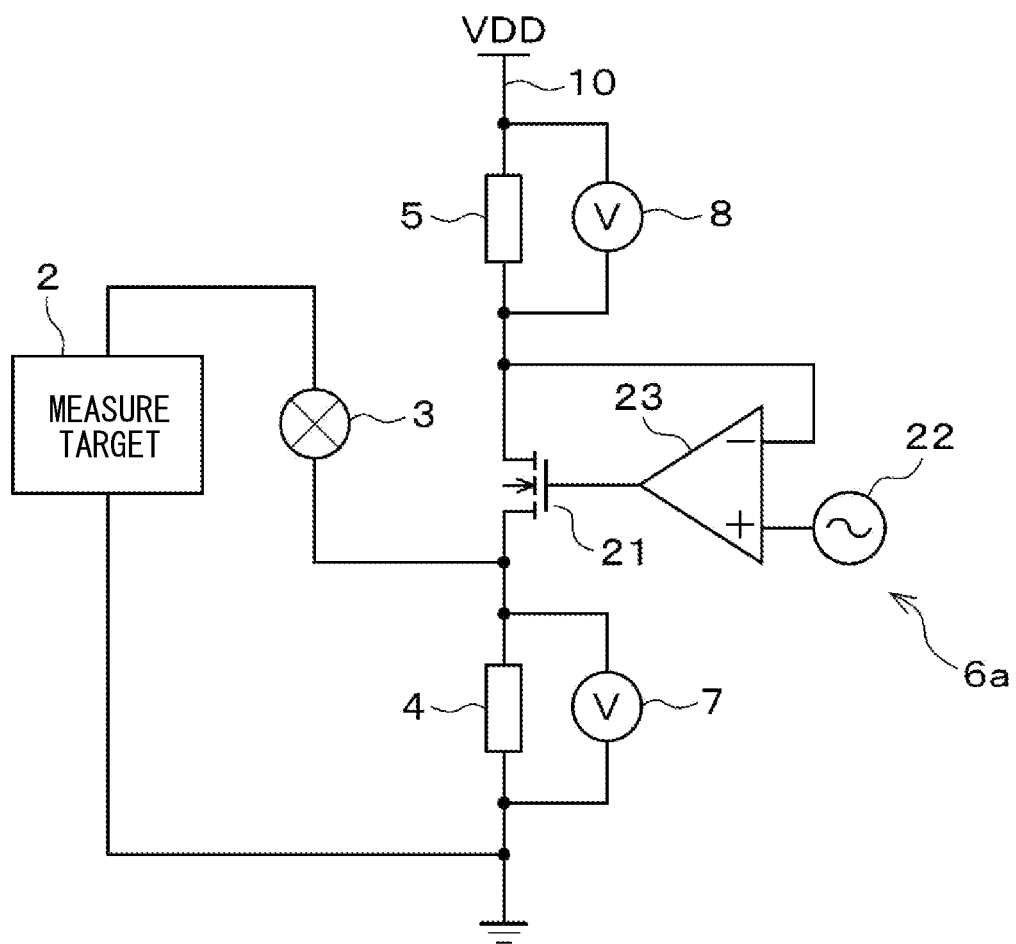
FIG. 2 is a diagram showing a specific first configuration example of the signal application unit according to the first embodiment.
Figure 3:
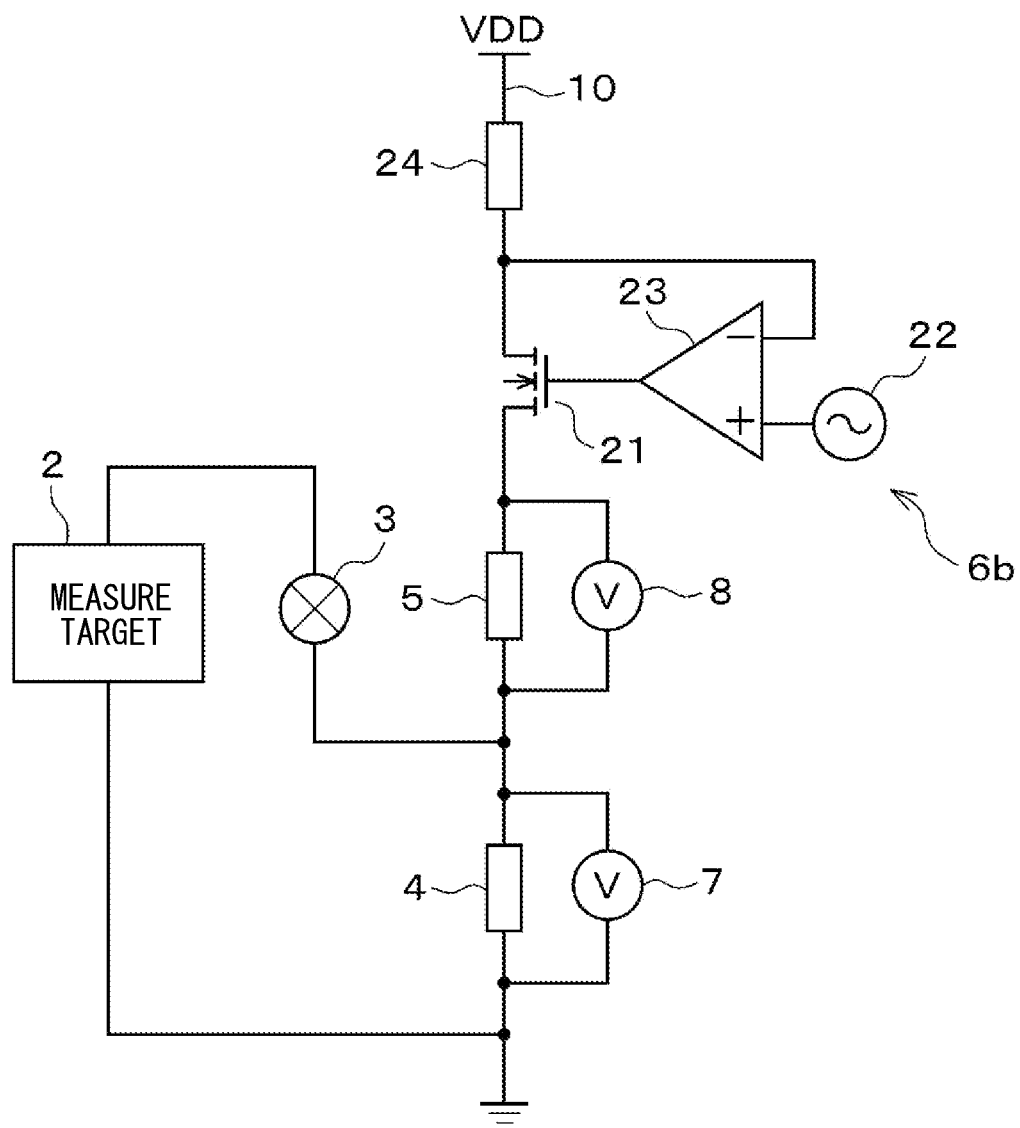
FIG. 3 is a diagram showing a specific second configuration example of the signal application unit according to the first embodiment.
Figure 4:
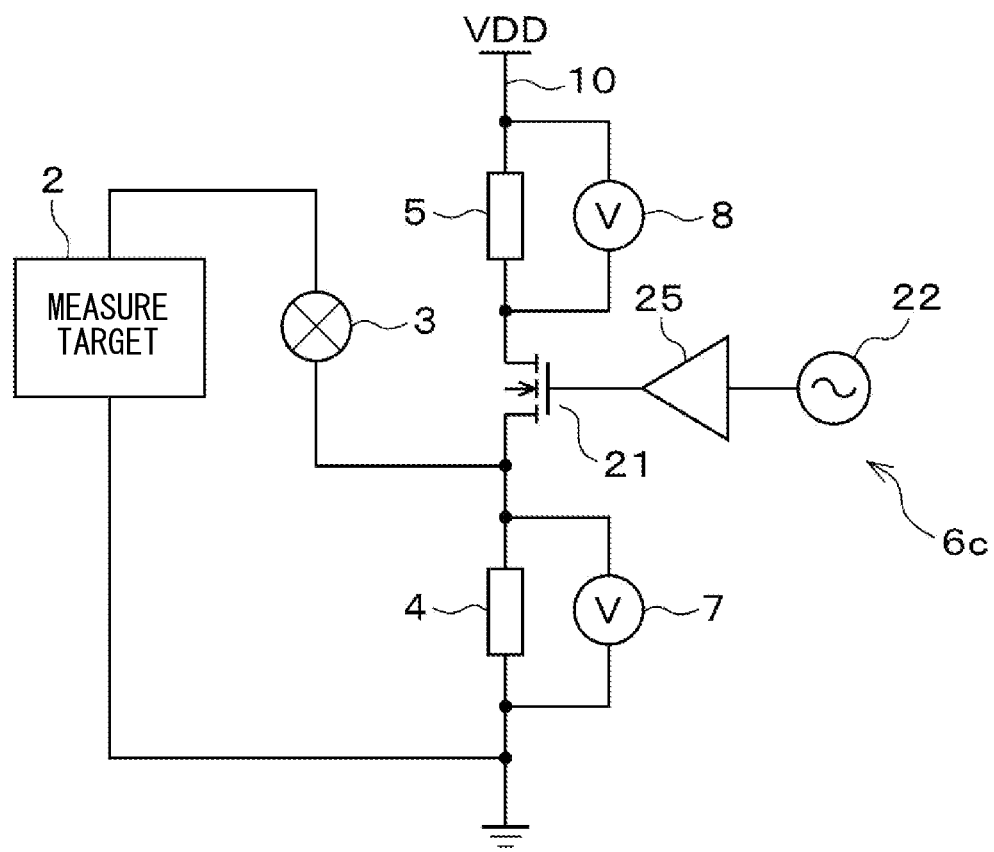
FIG. 4 is a diagram showing a specific third configuration example of the signal application unit according to the first embodiment.
Figure 5:
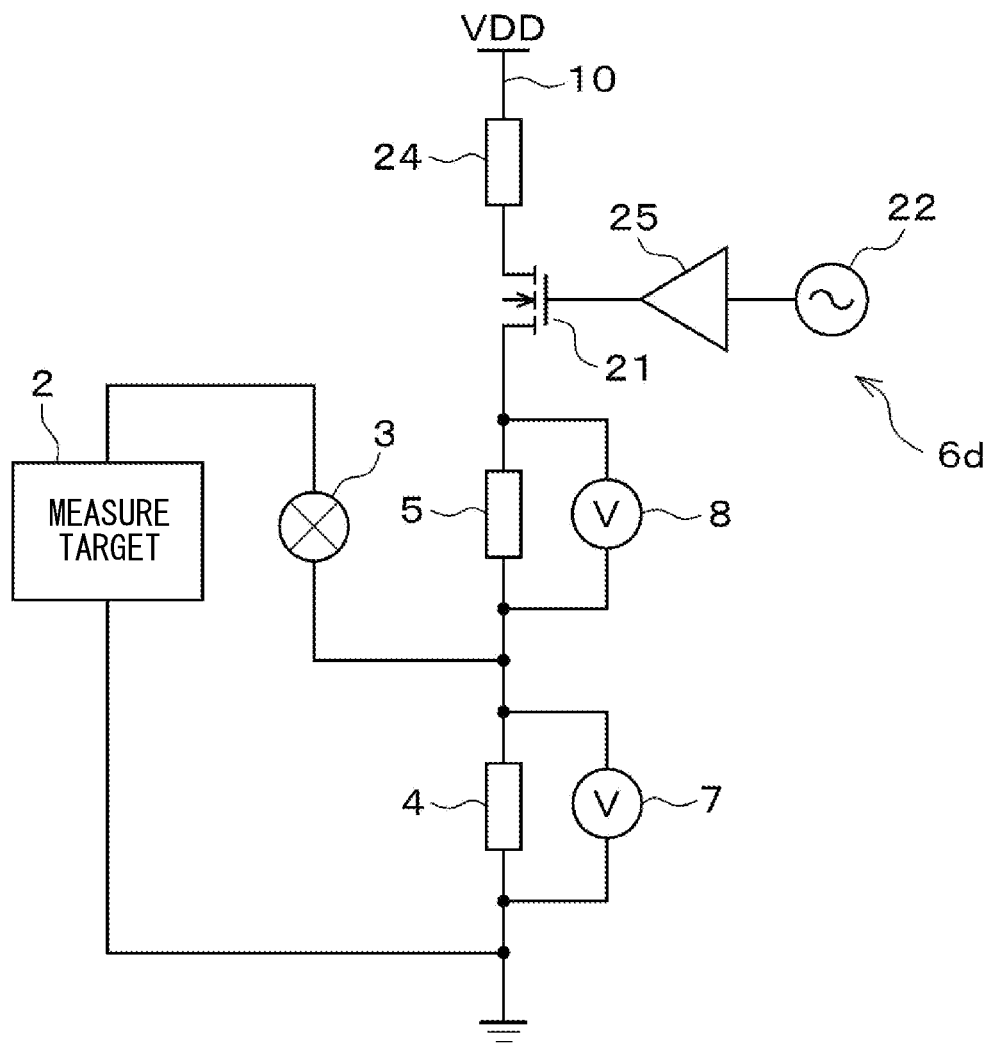
FIG. 5 is a diagram showing a specific fourth configuration example of the signal application unit according to the first embodiment.

Specific configurations of the signal application unit 6 include, for example, a first configuration example shown in FIG. 2, a second configuration example shown in FIG. 3, a third configuration example shown in FIG. 4, a fourth configuration example shown in FIG. 5, and the like.

[1] First Configuration Example

As shown in FIG. 2, the signal application unit 6a of the first configuration example includes a transistor 21, a signal generation unit 22, an OP amplifier 23, and the like. The transistor 21 is, for example, an N-channel MOSFET whose drain is connected to the power supply line 10 via a correction resistor 5 and source is connected to ground via a shunt resistor 4. The signal generation unit 22 generates and outputs a pulse wave signal or a sine wave signal having the same frequency as the alternating current applied to the series circuit of the shunt resistor 4 and the correction resistor 5.

The output signal of the signal generation unit 22 is given to the non-inverting input terminal of the OP amplifier 23. The inverting input terminal of the OP amplifier 23 is connected to the drain of the transistor 21, and its output terminal is connected to the gate of the transistor 21. According to the above configuration, the transistor 21 is driven by the OP amplifier 23, so that an AC signal, which is an alternating current, is applied to the series circuit of the shunt resistor 4 and the correction resistor 5. As described above, the signal application unit 6a of the first configuration example is configured to be driven by an amplifier. In this case, the correction resistor 5 also functions as a current source for the signal application unit 6a.

[2] Second Configuration Example

As shown in FIG. 3, the signal application unit 6b of the second configuration example is different from the signal application unit 6a of the first configuration example shown in FIG. 2 in that a resistor 24 is added. In this case, the drain of the transistor 21 is connected to the power line 10 via the resistor 24, and its source is connected to the ground via the correction resistor 5 and the shunt resistor 4.

Even with the above configuration, as in the first configuration example, the transistor 21 is driven by the OP amplifier 23, so that an AC signal, which is an alternating current, is applied to the series circuit of the shunt resistor 4 and the correction resistor 5. As described above, the signal application unit 6b of the second configuration example has an amplifier drive configuration like the signal application unit 6a of the first configuration example. In this case, the resistor 24 and the transistor 21 provided separately from the correction resistor 5 function as a current source of the signal application unit 6b.

[3] Third Configuration Example

As shown in FIG. 4, the signal application unit 6c of the third configuration example is different from the signal application unit 6a of the first configuration example shown in FIG. 2 in that a buffer 25 instead of the OP amplifier 23 is arranged. In this case, the output signal of the signal generation unit 22 is given to the input terminal of the buffer 25. The output terminal of the buffer 25 is connected to the gate of the transistor 21. According to the above configuration, the transistor 21 is driven by the buffer 25, so that an AC signal, which is an alternating current, is applied to the series circuit of the shunt resistor 4 and the correction resistor 5. As described above, the signal application unit 6c of the third configuration example has a buffer drive configuration.

[4] Fourth Configuration Example

As shown in FIG. 5, the signal application unit 6d of the fourth configuration example is different from the signal application unit 6b of the second configuration example shown in FIG. 3 in that a buffer 25 instead of the OP amplifier 23 is arranged. In this case, the output signal of the signal generation unit 22 is given to the input terminal of the buffer 25. The output terminal of the buffer 25 is connected to the gate of the transistor 21. According to the above configuration, the transistor 21 is driven by the buffer 25, so that an AC signal, which is an alternating current, is applied to the series circuit of the shunt resistor 4 and the correction resistor 5. As described above, the signal application unit 6d of the fourth configuration example has a buffer drive configuration.

[5] Features of Each Configuration Example

In the first configuration example and the third configuration example, since the correction resistor 5 is arranged close to the power supply line 10, and the shunt resistor 4 is arranged close to the ground, the first voltage detection unit 7 and the second voltage detection unit 7 detect voltages at potentials that are significantly different from each other. Therefore, according to the first configuration example and the third configuration example, although the detection errors of the terminal voltages of the shunt resistor 4 and the correction resistor 5 may be likely to occur with respect to the second configuration example and the fourth configuration example, the correction resistor 5 provides current sources for the application units 6a and 6c in common so that the number of elements can be suppressed to a small number as an advantage.

In the second configuration example and the fourth configuration example, since it is necessary to provide a resistor 24 different from the correction resistor 5 in order to configure the current source of the signal application units 6b and 6d, as a disadvantage, the number of elements increases compared with the first configuration example and the third configuration example. However, in the second configuration example and the fourth configuration example, since both the correction resistor 5 and the shunt resistor 4 are arranged close to the ground, the first voltage detection unit 7 and the second voltage detection unit 8 detect voltages at potentials similar to each other. Therefore, according to the second configuration example and the fourth configuration example, there is an advantage that the detection errors of the terminal voltages of the shunt resistor 4 and the correction resistor 5 can be suppressed to be smaller than those of the first configuration example and the third configuration example.

According to the first configuration example and the second configuration example of the amplifier drive configuration, the drain voltage of the transistor 21 is controlled to be constant by the operation of the OP amplifier 23, so that the first configuration example and the second configuration example have a merit, compared with the third configuration example and the fourth configuration example of the buffer drive configuration, such that the accuracy of the AC current applied to the series circuit of the shunt resistor 4 and the correction resistor 5 can be improved. On the other hand, according to the third configuration example and the fourth configuration example, there is an advantage that the circuit scale can be suppressed to a smaller size by using the buffer 25 instead of the OP amplifier 23 as compared with the first configuration example and the second configuration example.

<Specific Configuration of Each Synchronous Detection Circuit>

Figure 6:
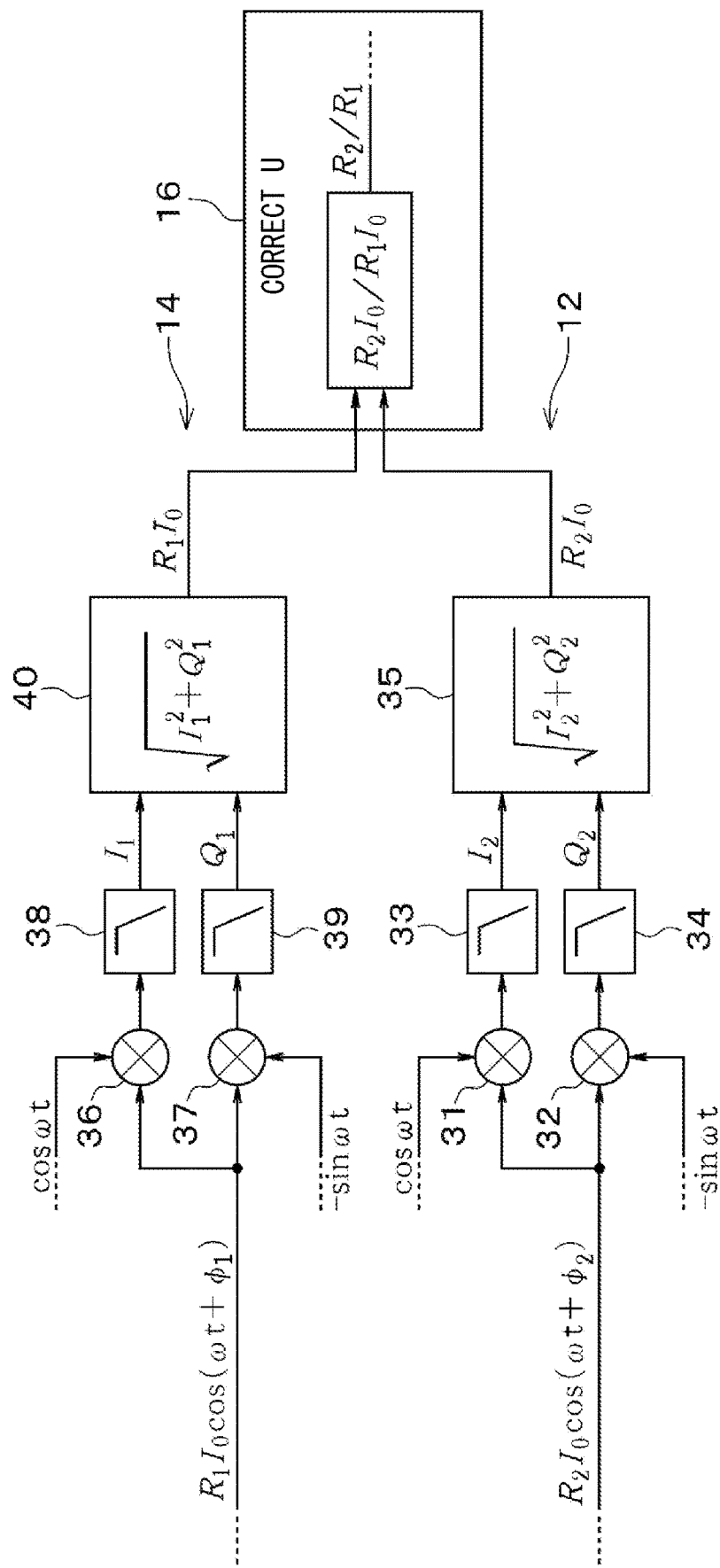
FIG. 6 is a specific configuration example of each synchronous detection circuit according to the first embodiment.

A specific configuration of the first synchronous detection circuit 12 and the second synchronous detection circuit 14 includes, for example, the configuration shown in FIG. 6. In this case, the alternating current signal, which is the AC current applied to the series circuit of the shunt resistor 4 and the correction resistor 5 by the signal application unit 6, is defined as "Io×cos (ωt)", and the resistance value of the shunt resistor 4 is defined as R2, and the resistance value of the correction resistor 5 is defined as R1. Here, ω is an angular frequency and t is a time.

As shown in FIG. 6, the first synchronous detection circuit 12 includes multipliers 31 and 32, low-pass filters 33 and 34, and an arithmetic unit 35. In this specification, the low-pass filter may be abbreviated as LPF. During the time of correction when the AC signal is applied to the series circuit of the shunt resistor 4 and the correction resistor 5, the digital signal output from the first A/D converter 11 is input into each one input terminal of the multipliers 31 and 32 of the first synchronous detection circuit 12. This digital signal is a signal corresponding to the terminal voltage of the shunt resistor 4 in the time of correction, and is defined as "R2×Io×cos (ωt+φ2)".

A cosine wave signal of "cos (ωt)" is input to the other input terminal of the multiplier 31. A sine wave signal of "−sin (ωt)" is input to the other input terminal of the multiplier 32. As a result, in each output signal of the multipliers 31 and 32, the signal having the angular frequency ω is extracted as a direct current component. The output signals of the multipliers 31 and 32 are input to the LPFs 33 and 34, respectively.

The output signal I2 of the LPF 33 is a low frequency signal proportional to the in-phase component of the input signal, and the output signal Q2 of the LPF 34 is a low frequency signal proportional to the orthogonal phase component of the input signal. The arithmetic unit 35 calculates the square root of the sum of squares of the signal I2 and the signal Q2, and outputs a signal representing the calculation result. The output signal of the arithmetic unit 35 is expressed as "R2×Io". The output signal of the arithmetic unit 35 becomes an output signal of the first synchronous detection circuit 12, and is given to the correction unit 16 of the control unit 9.

The second synchronous detection circuit 14 includes multipliers 36 and 37, low-pass filters 38 and 39, and an arithmetic unit 40. During the time of correction when the AC signal is applied to the series circuit of the shunt resistor 4 and the correction resistor 5, the digital signal output from the second A/D converter 13 is input into each one input terminal of the multipliers 36 and 37 of the second synchronous detection circuit 14. This digital signal is a signal corresponding to the terminal voltage of the correction resistor 5 in the time of correction, and is defined as "R1×Io×cos (ωt+φ1)".

A cosine wave signal of "cos (ωt)" is input to the other input terminal of the multiplier 36. A sine wave signal of "−sin (ωt)" is input to the other input terminal of the multiplier 37. As a result, in each output signal of the multipliers 36 and 37, the signal having the angular frequency ω is extracted as a direct current component. The output signals of the multipliers 36 and 37 are input to the LPFs 38 and 39, respectively.

The output signal I1 of the LPF 38 is a low frequency signal proportional to the in-phase component of the input signal, and the output signal Q1 of the LPF 39 is a low frequency signal proportional to the orthogonal phase component of the input signal. The arithmetic unit 40 calculates the square root of the sum of squares of the signal I1 and the signal Q1, and outputs a signal representing the calculation result. The output signal of the arithmetic unit 40 is expressed as "R1×Io". The output signal of the arithmetic unit 40 becomes an output signal of the second synchronous detection circuit 14, and is given to the correction unit 16 of the control unit 9.

The correction unit 16 obtains the value "R2/R1" by dividing the output signal "R2/Io" of the first synchronous detection circuit 12 by the output signal "R1/Io" of the second synchronous detection circuit 14. Here, the resistance value R1 of the correction resistor 5 is a known value and is stored in advance in the memory of the control unit 9 or the like. Therefore, the correction unit 16 multiplies the value "R2/R1" obtained as described above by the resistance value R1 stored in advance, so that the resistance value R2 of the shunt resistor 4 at the present time, that is, the calculation resistance value can be calculated.

The above-described embodiment provides the following effect.

A current sensor 1 according to the present embodiment detects a detection target current based on a terminal voltage of a shunt resistor 4 provided in series in a path through which the detection target current flows and a resistance value for current detection corresponding to a resistance value of the shunt resistor 4. The current sensor includes a resistance value correction circuit 17 for correcting the resistance value for current detection. The resistance value correction circuit 17 includes a correction resistor 5, a signal application unit 6, a first voltage detection unit 7, a second voltage detection unit 8, and a correction unit 16. The correction resistor 5 is connected in series together with the shunt resistor in a path different from the path through which the detection target current flows, and the resistance accuracy thereof is higher than that of the shunt resistor 4.

The signal application unit 6 applies an AC signal to the series circuit of the shunt resistor 4 and the correction resistor 5. The first voltage detection unit 7 detects the terminal voltage of the shunt resistor 4 when the AC signal is applied to the series circuit. The second voltage detection unit 8 detects the terminal voltage of the correction resistor 5 when the AC signal is applied to the series circuit. The correction unit 16 calculates the resistance value of the shunt resistor 4 based on the first voltage detection value which is the terminal voltage detection value by the first voltage detection unit 7 and the second voltage detection value which is the terminal voltage detection value by the second voltage detection unit 8, and corrects the resistance value for detection based on the calculated resistance value which is the calculated resistance value of the shunt resistor 4.

According to such a configuration, it is possible to directly correct the resistance value for detection by using the shunt resistor 4 without indirectly correcting the resistance value for detection by using the sub-resistors as in the first conceivable technique. Further, according to the above configuration, unlike the second conceivable technique, it is not necessary to provide a plurality of shunt resistors nor to provide an input terminal at the center of the shunt resistors, and only one shunt resistor 4 needs to be provided, so that the configuration of the entire current sensor 1 is not complicated.

Further, according to the above configuration, the calculation accuracy of the calculated resistance value and the correction accuracy of the resistance value for detection greatly depend on the accuracy of the resistance value of the correction resistor 5 and the detection accuracy of the first voltage detection value and the second voltage detection value. In this case, since the correction resistor 5 has a higher resistance value than the shunt resistor 4, the correction accuracy of the resistance value for detection is sufficiently improved. Therefore, according to the above embodiment, it is possible to obtain an excellent effect that the resistance value for detection can be corrected with high accuracy without complicating the configuration of the entire current sensor 1.

In this case, the first voltage detection unit 7 includes a first synchronous detection circuit 12 that inputs the signal of the terminal of the shunt resistor 4 and synchronously detects the signal at the same frequency as the AC signal to extract and output the signal, and the first voltage detection unit 7 is configured to detect the terminal voltage of the shunt resistor 4 based on the output signal of the first synchronous detection circuit 12. Further, in this case, the second voltage detection unit 8 includes the second synchronous detection circuit 14 that inputs the signal of the terminal of the correction resistor 5 and synchronously detects the signal at the same frequency as the AC signal, extracts and outputs the signal, and the second voltage detection unit 8 is configured to detect the terminal voltage of the correction resistor 5 based on the output signal of the second synchronous detection circuit 14.

According to such a configuration, the terminal voltages of the shunt resistor 4 and the correction resistor 5 are detected based on the signal extracted by synchronous detection at the same frequency as the frequency of the AC signal applied to the shunt resistor 4 and the correction resistor 5. Therefore, according to the present embodiment, the detection accuracy of the detection value of each of the first voltage detection value and the second voltage detection value is restricted from being reduced due to the influence of noise such as thermos-electromotive force and an offset on the circuit side, and as a result, the accuracy of correction of the resistance value for detection can be further improved.

The signal application unit 6 applies a pulse wave or sinusoidal AC signal to the series circuit of the shunt resistor 4 and the correction resistor 5. When the signal application unit 6 applies a sine wave AC signal, the configuration for generating the AC signal, specifically, the configuration of the signal generation unit 22 is complicated, but the signal includes only a frequency component desired as an AC signal. Thus, the detection error of the first voltage detection value and the second voltage detection value can be suppressed to a low level, in other words, the accuracy of correction of the resistance value for detection can be improved. On the other hand, when the signal application unit 6 applies a pulse wave AC signal, an error may occur in the detection value of each of the first voltage detection value and the second voltage detection value because the AC signal includes a harmonic component. However, the configuration for generating an AC signal, specifically, the configuration of the signal generation unit 22 can be simplified.

Second Embodiment

The second embodiment of the present disclosure is described with reference to FIGS. 7 to 9.

(General Configuration)

Figure 7:
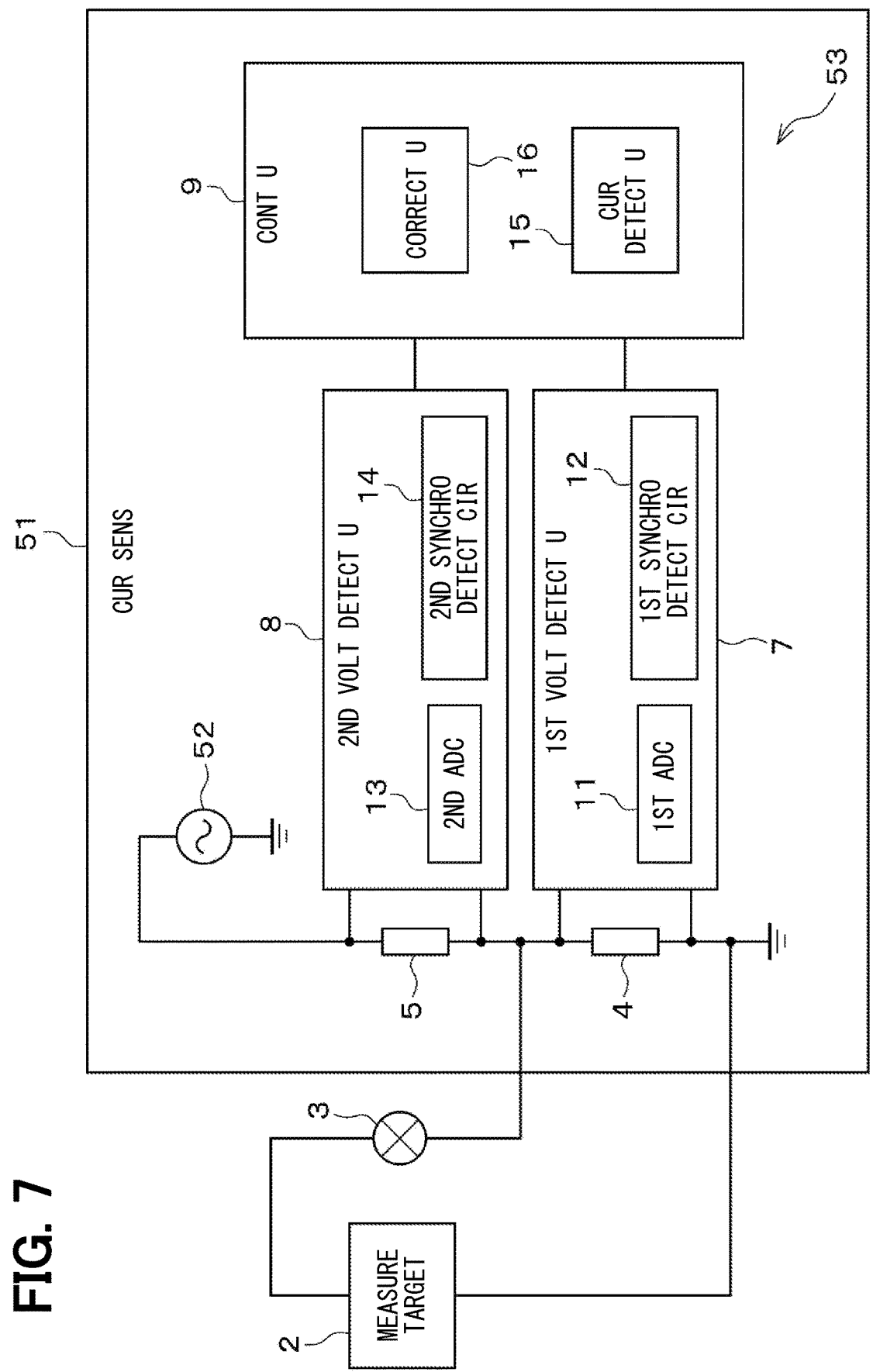
FIG. 7 is a diagram schematically showing a configuration of a current sensor according to a second embodiment.

As shown in FIG. 7, the current sensor 51 of the present embodiment is different from the current sensor 1 of the first embodiment shown in FIG. 1 in that the signal application unit 52 instead of the signal application unit 6 is arranged.

Similar to the signal application unit 6, the signal application unit 52 applies a pulse wave signal or a sine wave AC signal to the series circuit of the shunt resistor 4 and the correction resistor 5 at the time of correction. In this case, the signal application unit 52 is configured as a voltage source for supplying an AC voltage to the series circuit of the shunt resistor 4 and the correction resistor 5. As described above, in the above configuration, the resistance value correction circuit 53 for correcting the resistance value for detection is configured by the correction resistor 5, the signal application unit 52, the first voltage detection unit 7, the second voltage detection unit 8, and the correction unit 16.

<Specific Configuration of Signal Application Unit>

Figure 8:
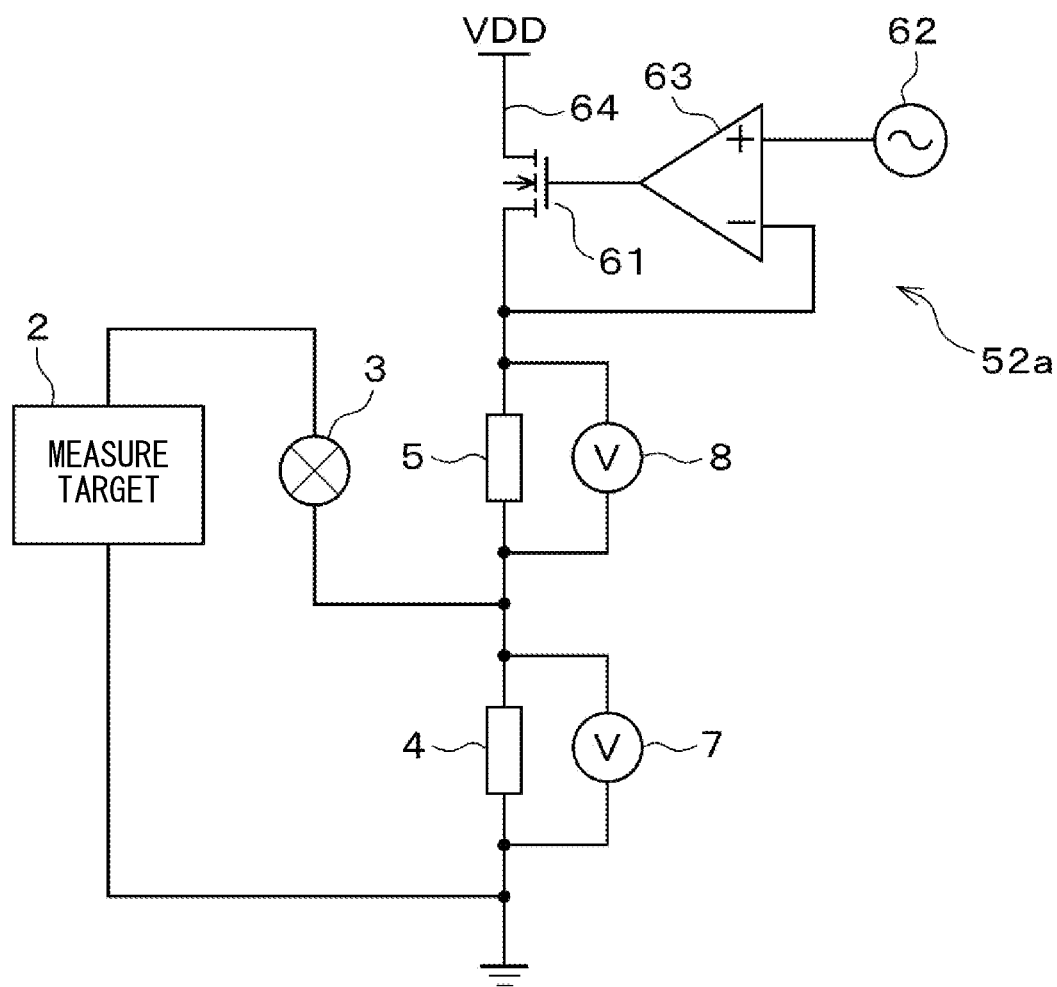
FIG. 8 is a diagram showing a specific first configuration example of the signal application unit according to the second embodiment.
Figure 9:
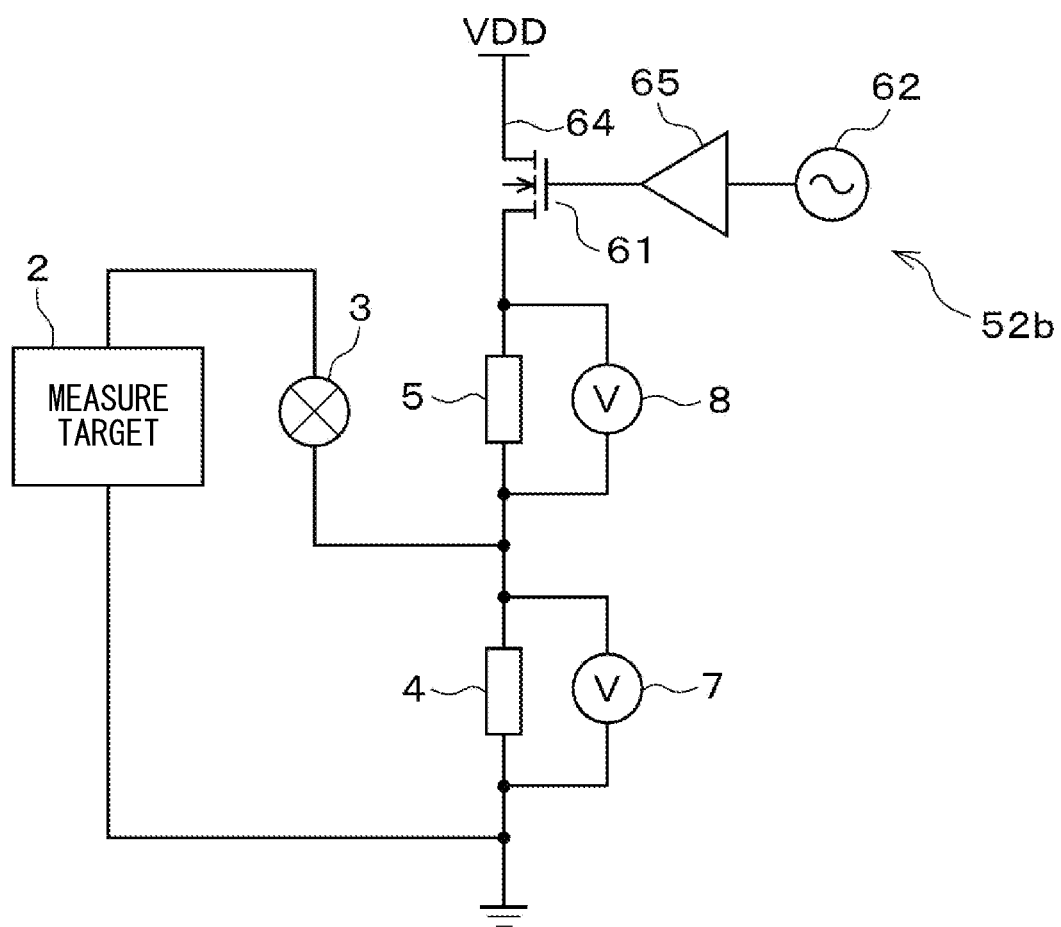
FIG. 9 is a diagram showing a specific second configuration example of the signal application unit according to the second embodiment.

Specific examples of the signal application unit 52 include a first configuration example shown in FIG. 8, a second configuration example shown in FIG. 9, and the like.

[1] First Configuration Example

As shown in FIG. 8, the signal application unit 52a of the first configuration example includes a transistor 61, a signal generation unit 62, an OP amplifier 63, and the like. The transistor 61 is, for example, an N-channel MOSFET, its drain is connected to a power supply line 64 to which a power supply voltage VDD such as +5V is supplied, and its source is connected to ground via correction resistor 5 and a shunt resistor 4.

The signal generation unit 62 generates and outputs a pulse wave signal or a sine wave signal having the same frequency as the alternating current voltage applied to the series circuit of the shunt resistor 4 and the correction resistor 5. The output signal of the signal generation unit 62 is given to the non-inverting input terminal of the OP amplifier 63. The inverting input terminal of the OP amplifier 63 is connected to the source of the transistor 61, and its output terminal is connected to the gate of the transistor 61. According to the above configuration, the transistor 61 is driven by the OP amplifier 63, so that an AC signal, which is an alternating current voltage, is applied to the series circuit of the shunt resistor 4 and the correction resistor 5. As described above, the signal application unit 52a of the first configuration example is configured to be driven by an amplifier.

[2] Second Configuration Example

As shown in FIG. 9, the signal application unit 52b of the second configuration example is different from the signal application unit 52a of the first configuration example shown in FIG. 8 in that a buffer 65 instead of the OP amplifier 63 is arranged. In this case, the output signal of the signal generation unit 62 is given to the input terminal of the buffer 65. The output terminal of the buffer 65 is connected to the gate of the transistor 61. According to the above configuration, the transistor 61 is driven by the buffer 65, so that an AC signal, which is an alternating current voltage, is applied to the series circuit of the shunt resistor 4 and the correction resistor 5. As described above, the signal application unit 52b of the second configuration example has a buffer drive configuration.

[3] Features of Each Configuration Example

According to the first configuration example of the amplifier drive configuration, the source voltage of the transistor 61 is controlled to be constant by the operation of the OP amplifier 63, so that the first configuration example has a merit, compared with the second configuration example of the buffer drive configuration, such that the accuracy of the AC current voltage applied to the series circuit of the shunt resistor 4 and the correction resistor 5 can be improved. On the other hand, according to the second configuration example, there is an advantage that the circuit scale can be suppressed to be a smaller size by using the buffer 65 instead of the OP amplifier 63 as compared with the first configuration example.

As described above, the current sensor 51 of the present embodiment includes a resistance value correction circuit 53 capable of performing the same operation as the resistance value correction circuit 17 of the first embodiment except for the feature such that the AC signal applied to the series circuit of the shunt resistor 4 and the correction resistors 5 and 6 is changed from the AC current to the AC voltage at the time of correction in the first embodiment. Therefore, also in this embodiment, it is possible to correct the resistance value for detection in the same manner as in the first embodiment, and the same effect as in the first embodiment can be obtained.

Third Embodiment

The third embodiment of the present disclosure is described with reference to FIGS. 10 to 13.

Figure 10:
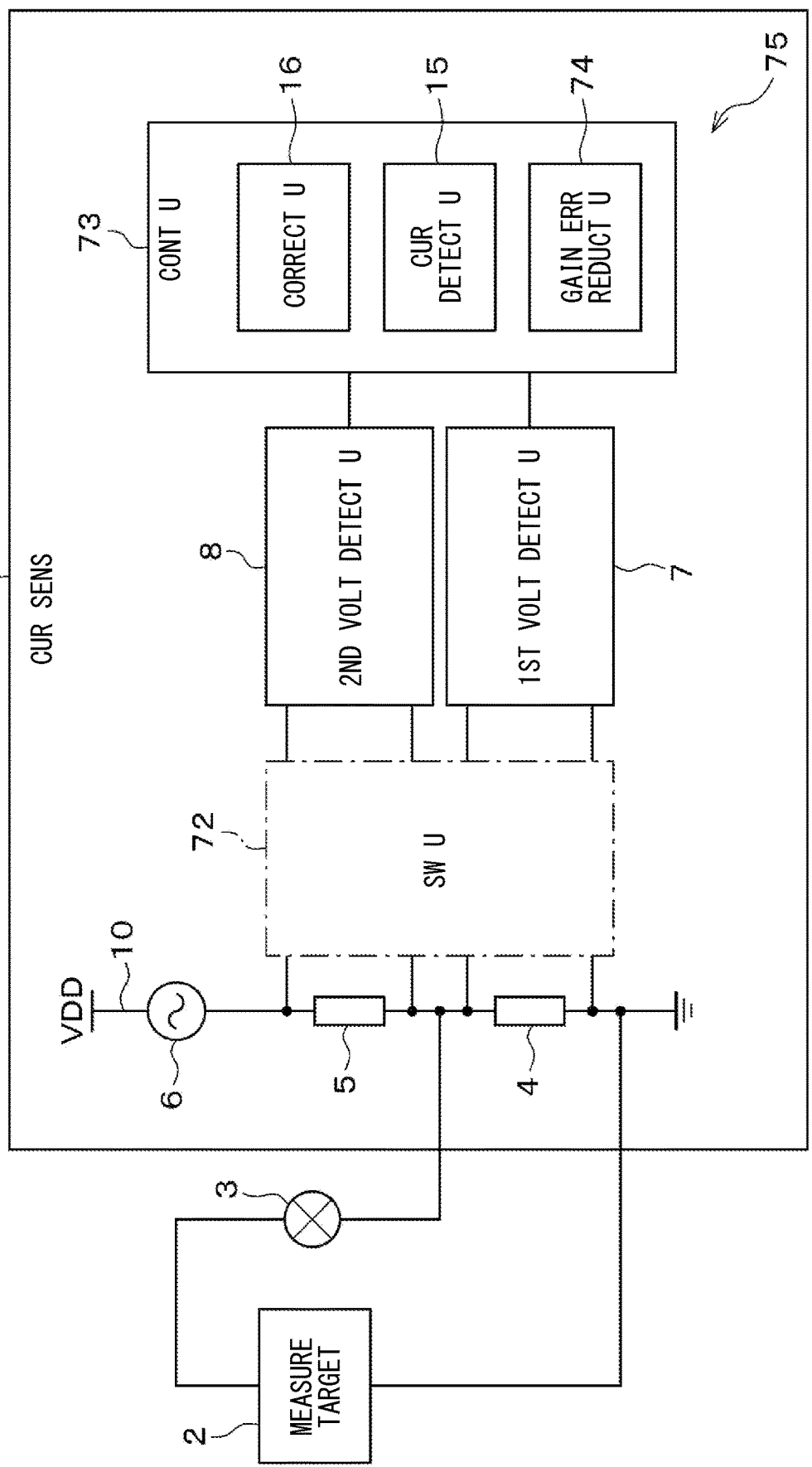
FIG. 10 is a diagram schematically showing a configuration of a current sensor according to a third embodiment.

As shown in FIG. 10, the current sensor 71 of the present embodiment has a switching unit 72 added to the current sensor 1 of the first embodiment shown in FIG. 1, and has a control unit 73 instead of the control unit 9, which are different from the first embodiment. The switching unit 72 includes, for example, a multiplexer or the like, and switches the connection state between each terminal of the shunt resistor 4 and the correction resistor 5 and each input terminal of the first voltage detection unit 7 and the second voltage detection unit 8. The operation of the switching unit 72 is controlled by the control unit 73.

Figure 11:
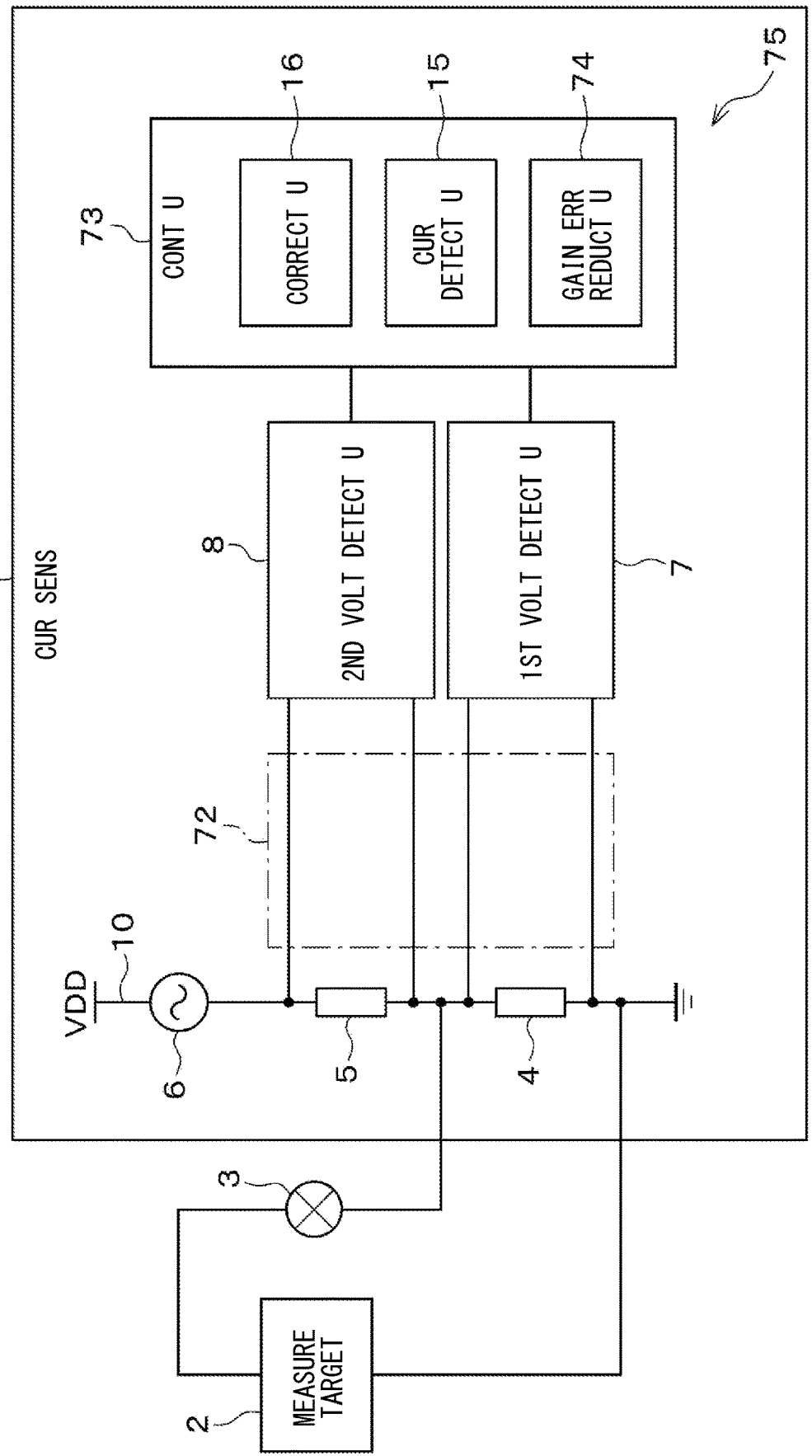
FIG. 11 is a diagram schematically showing a configuration of a current sensor switched to a first connection state according to the third embodiment.
Figure 12:
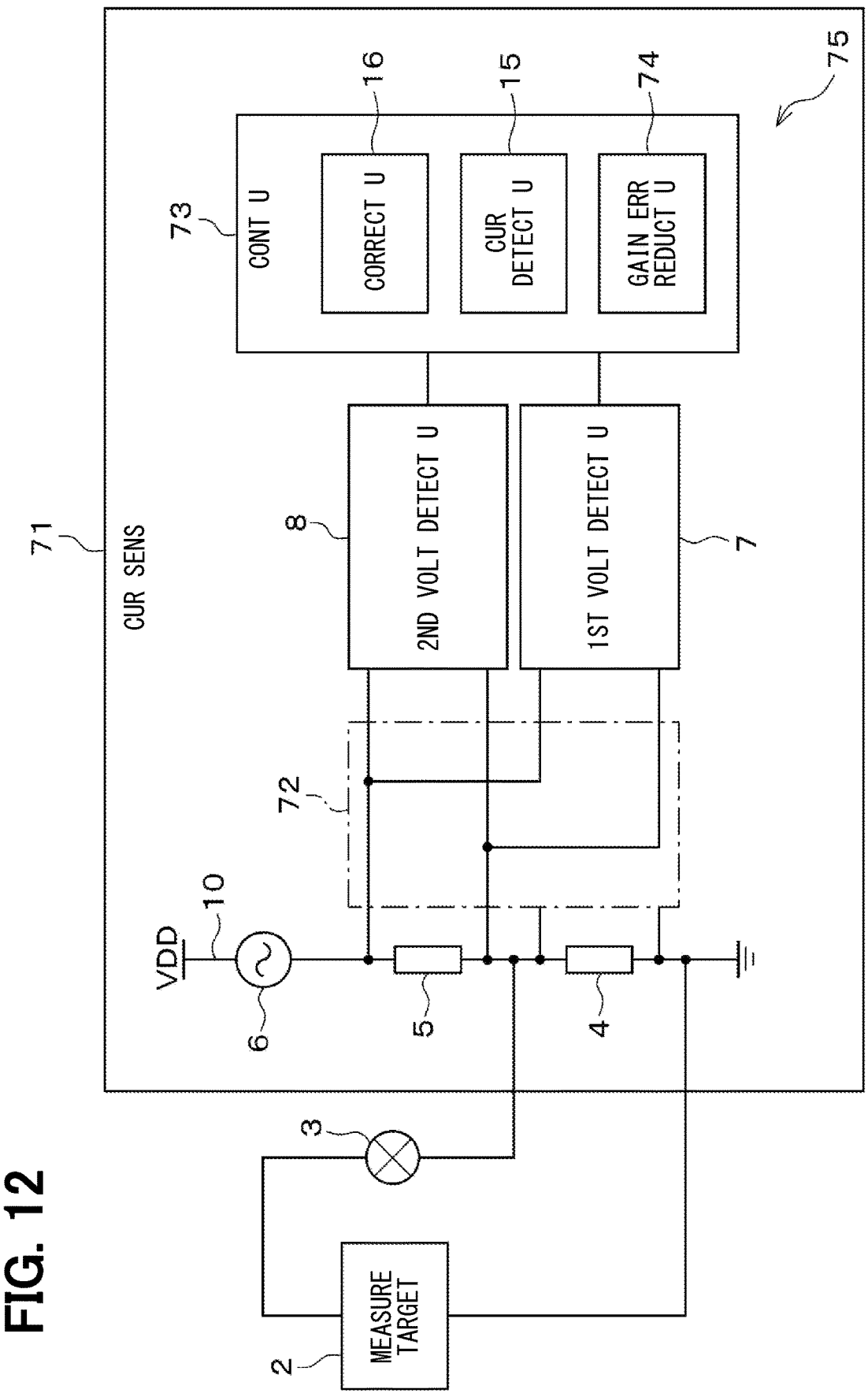
FIG. 12 is a diagram schematically showing a configuration of a current sensor switched to a second connection state according to the third embodiment.
Figure 13:
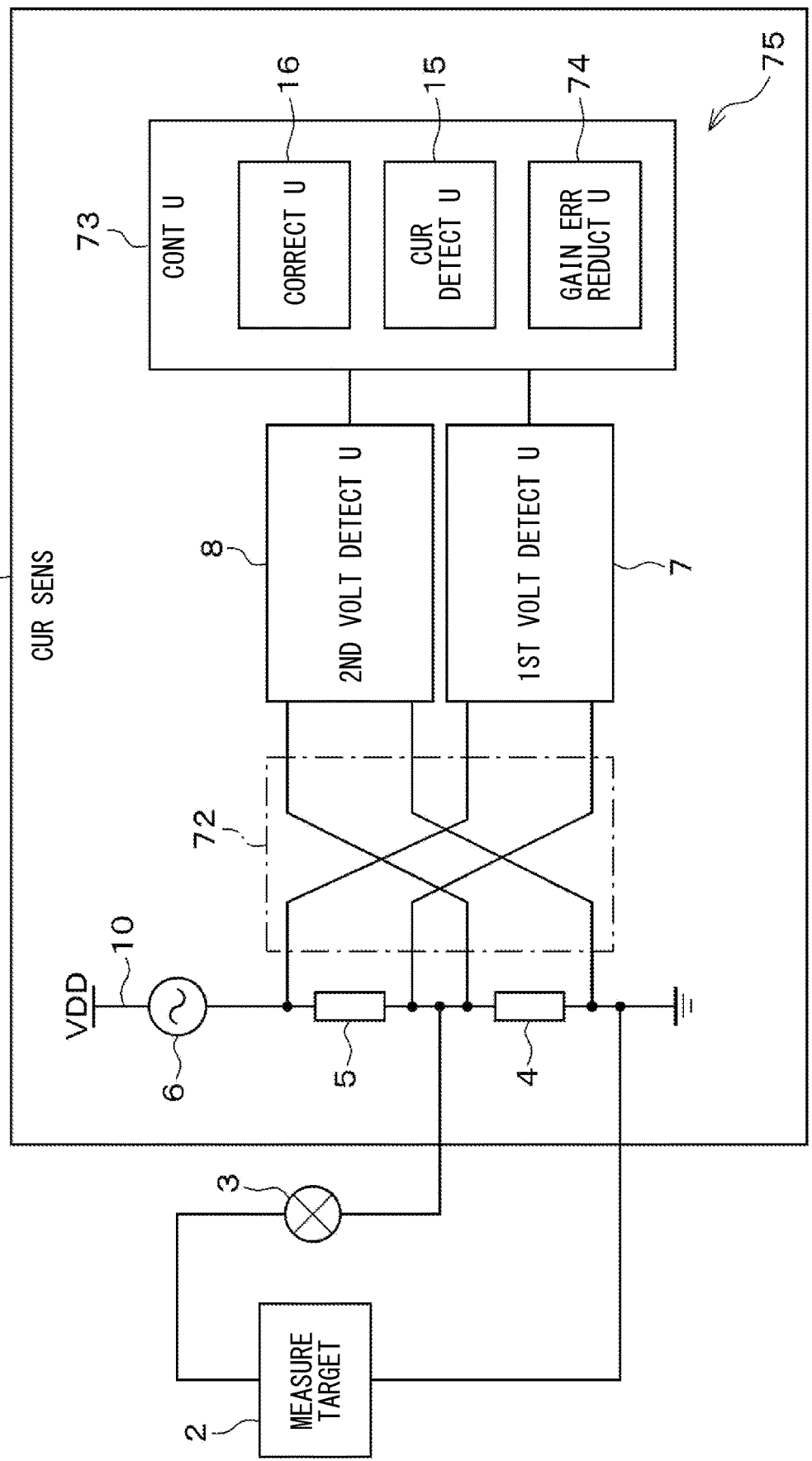
FIG. 13 is a diagram schematically showing a configuration of a current sensor switched to a third connection state according to the third embodiment.

Specifically, the switching unit 72 switches to three connection states that include: a first connection state as shown in FIG. 11, a second connection state as shown in FIG. 12, and a third connection state as shown in FIG. 13. As shown in FIG. 11, in the first connection state, each terminal of the shunt resistor 4 is connected to each input terminal of the first voltage detection unit 7, and each terminal of the correction resistor 5 is connected to each input terminal of the second voltage detection unit 8. That is, the first connection state is the same connection state as the current sensor 1 of the first embodiment which does not have the switching unit 72.

As shown in FIG. 12, in the second connection state, each terminal of the correction resistor 5 is connected to each input terminal of the first voltage detection unit 7, and each terminal of the correction resistor 5 is connected to each input terminal of the second voltage detection unit 8. As shown in FIG. 13, in the third connection state, each terminal of the correction resistor 5 is connected to each input terminal of the first voltage detection unit 7, and each terminal of the shunt resistor 4 is connected to each input terminal of the second voltage detection unit 8.

The control unit 73 is different from the control unit 9 in that a functional block of a gain error reduction unit 74 is added. In the above configuration, the resistance value correction circuit 75 that corrects the resistance value for detection is configured by the correction resistor 5, the signal application unit 6, the first voltage detection unit 7, the second voltage detection unit 8, the correction unit 16, and the gain error reduction unit 74. The gain error reduction unit 74 reduces the gain error of the first A/D converter 11 of the first voltage detection unit 7 and the second A/D converter 13 of the second voltage detection unit 8.

The gain error reduction unit 74 switches the connection state of the switching unit 72 to the first connection state when the operation for reducing the gain error is not performed, that is, at the normal time or at the time of correction for correcting the resistance value for detection. Then, the gain error reduction unit 74 reduces the gain errors of the first A/D converter 11 and the second A/D converter 13 by switching the connection state of the switching unit 72 to the second connection state or the third connection state.

That is, in the second connection state, both the first voltage detection unit 7 and the second voltage detection unit 8 can detect the terminal voltage of the correction resistor 5. Then, the signal representing these detected values is given to the gain error reduction unit 74. Therefore, in the second connection state, the gain error reduction unit 74 reduces the gain error of the first A/D converter 11 and the second A/D converter 13 based on the detection value of the terminal voltage of the correction resistor 5 detected by the first voltage detection unit 7 and the detection value of the terminal voltage of the correction resistor 5 detected by the second voltage detection unit 8. In this case, the gain error reduction unit 74 can, for example, perform corrections so that the gains of the first A/D converter 11 and the second A/D converter 13 are the same.

In the first connection state, the first voltage detection unit 7 can detect the terminal voltage of the shunt resistor 4, and the second voltage detection unit 8 can detect the terminal voltage of the correction resistor 5. In the third connection state, the first voltage detection unit 7 can detect the terminal voltage of the correction resistor 5, and the second voltage detection unit 8 can detect the terminal voltage of the shunt resistor 4, which are opposite to the first connection state. Then, the signal representing these detected values is given to the gain error reduction unit 74.

Therefore, the gain error reduction unit 74 reduces the gain error of the first A/D converter 11 and the second A/D converter 13 based on the detection value of the terminal voltage of the shunt resistor 4 detected by the first voltage detection unit 7 in the first connection state and the detection value of the terminal voltage of the shunt resistor 4 detected by the second voltage detection unit 8 in the third connection state. Further, the gain error reduction unit 74 reduces the gain error of the first A/D converter 11 and the second A/D converter 13 based on the detection value of the terminal voltage of the correction resistor 5 detected by the second voltage detection unit 8 in the first connection state and the detection value of the terminal voltage of the correction resistor 5 detected by the first voltage detection unit 7 in the third connection state. In these cases, the gain error reduction unit 74 can reduce the gain error by, for example, averaging the two detected values to cancel each gain error.

As described above, the resistance value correction circuit 75 of the current sensor 71 of the present embodiment includes a gain error reduction unit 74 for reducing each gain error of the first A/D converter 11 of the first voltage detection unit 7, and the second A/D converter 13 of the second voltage detection unit 8. According to such a configuration, the gain errors of the first A/D converter 11 and the second A/D converter 13 can be reduced to a very small value such as 0.1%. Therefore, according to the present embodiment, the detection accuracy of the terminal voltage of the shunt resistor 4 by the first voltage detection unit 7 and the detection accuracy of the terminal voltage of the correction resistor 5 by the second voltage detection unit 8 are further improved, and as a result, the accuracy of correction of the resistance value for detection is further improved.

Fourth Embodiment

A fourth embodiment will be described below with reference to FIG. 14.

Figure 14:
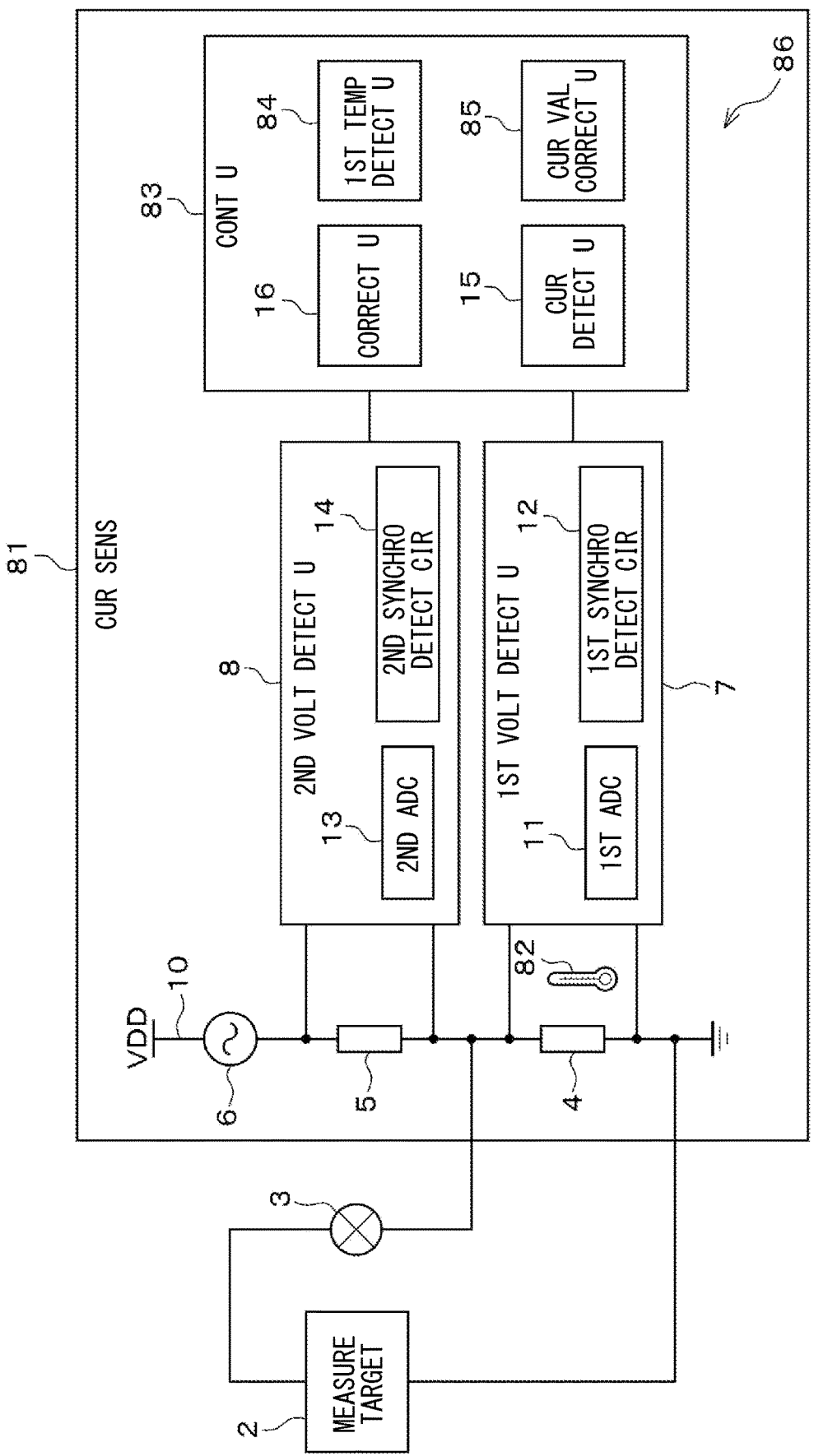
FIG. 14 is a diagram schematically showing a configuration of a current sensor according to a fourth embodiment.

As shown in FIG. 14, the current sensor 81 of the present embodiment is different from the current sensor 1 of the first embodiment shown in FIG. 1 in that a temperature sensor 82 is added, and the current sensor 81 has a control unit 83 instead of the control unit 9. The temperature sensor 82 is provided in the vicinity of the shunt resistor 4, and outputs a first temperature detection signal according to the temperature of the shunt resistor 4. The control unit 83 is different from the control unit 9 in that functional blocks such as a first temperature detection unit 84 and a current value correction unit 85 are added.

In the above configuration, the resistance value correction circuit 86 that corrects the resistance value for detection is provided by the correction resistor 5, the signal application unit 6, the first voltage detection unit 7, the second voltage detection unit 8, the correction unit 16, the first temperature detection unit 84, and the current value correction circuit 85. The first temperature detection unit 84 detects the temperature of the shunt resistor 4 based on the temperature detection signal output from the temperature sensor 82. The current value correction unit 85 cooperates with the correction unit 16 to perform the following operations. That is, the current value correction unit 85 corrects the resistance value for detection based on the calculated resistance value and the temperature detection value by the first temperature detection unit 84 as the first temperature detection value. Specifically, the current value correction unit 85 corrects the resistance value for detection based on the calculated resistance value after grasping the temperature of the shunt resistor 4 based on the first temperature detection value, and finally, corrects the detection value of the detection target current. In this way, the current value correction unit 85 corrects the detected value of the detection target current based on the first temperature detection value.

As described above, the resistance value correction circuit 86 of the current sensor 81 of the present embodiment includes the current value correction unit 85 that corrects the resistance value for detection and, finally, corrects the detection value of the detection target current based on the first temperature detection value as the detected temperature of the first temperature detection unit 84 together with the first temperature detection unit 84 that detects the temperature of the shunt resistor 4. According to such a configuration, it is possible to correct the resistance value for detection with high accuracy, and corrects the detection target current with high accuracy, taking into consideration the temperature characteristic of the resistance value of the shunt resistor 4.

Fifth Embodiment

A fifth embodiment will be described below with reference to FIG. 15.

Figure 15:
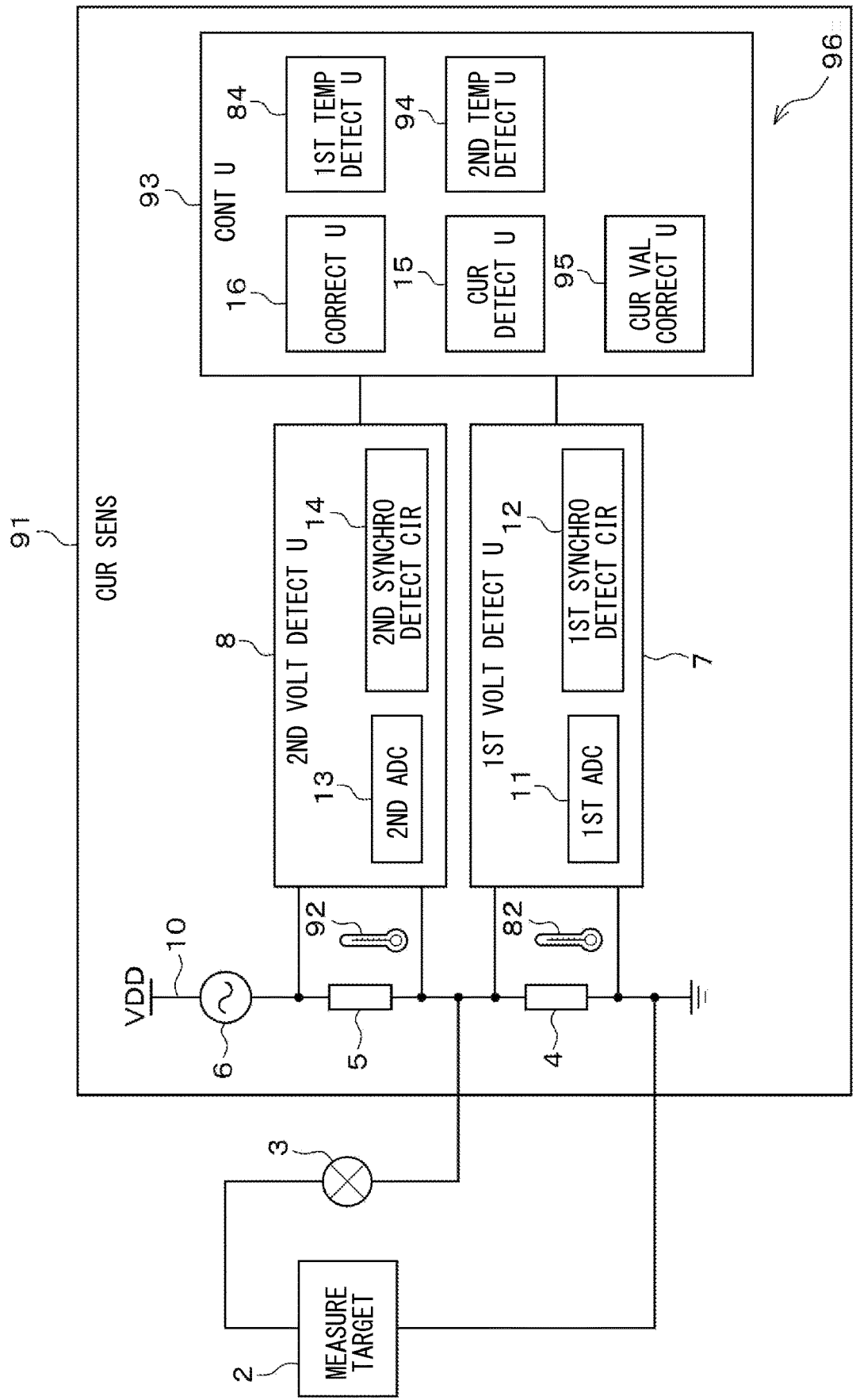
FIG. 15 is a diagram schematically showing a configuration of a current sensor according to a fifth embodiment.

As shown in FIG. 15, the current sensor 91 of the present embodiment is different from the current sensor 81 of the fourth embodiment shown in FIG. 14 in that a temperature sensor 92 is added, and the current sensor 91 has a control unit 93 instead of the control unit 83. The temperature sensor 92 is provided in the vicinity of the correction resistor 5, and outputs a second temperature detection signal corresponding to the temperature of the correction resistor 5. The control unit 93 differs from the control unit 83 in that a functional block of a second temperature detection unit 94 is added, and a current value correction unit 95 is provided in place of the current value correction unit 85.

In the above configuration, the resistance value correction circuit 96 that corrects the resistance value for detection is provided by the correction resistor 5, the signal application unit 6, the first voltage detection unit 7, the second voltage detection unit 8, the correction unit 16, the first temperature detection unit 84, the second temperature detection unit 94, and the current value correction circuit 95. The second temperature detection unit 94 detects the temperature of the correction resistor 5 based on the second temperature detection signal output from the temperature sensor 92. In addition to the same operation as the current value correction unit 85, the current value correction unit 95 performs the following operations in cooperation with the correction unit 16. That is, the current value correction unit 95 corrects the correction resistor value based on the second temperature detection value as the detected temperature of the second temperature detection unit 94, and calculates the calculation resistance value using the corrected correction resistor value. In other words, the current value correction unit 95 corrects the calculated resistance value based on the second temperature detection value. Then, the current value correction unit 95 corrects the resistance value for detection based on the calculation resistance value after the correction and the first temperature detection value, and eventually corrects the detection value of the detection target current. As described above, the current value correction unit 95 corrects the detected value of the detection target current based on the first temperature detection value and the second temperature detection value.

As described above, the resistance value correction circuit 96 of the current sensor 91 of the present embodiment has a first temperature detection unit 84 that detects the temperature of the shunt resistor 4, and a second temperature detection unit 94 that detects the temperature of the correction resistor 5, and a current value correction unit 95. In this case, the current value correction unit 95 corrects the resistance value for detection and, by extension, the detection value of the detection target current based on the first temperature detection value which is the temperature detection value by the first temperature detection unit 84 and the second temperature detection value which is the temperature detection value by the second temperature detection unit 94.

According to such a configuration, not only the temperature characteristic of the resistance value of the shunt resistor 4 but also the temperature characteristic of the resistance value of the correction resistor 5 is taken into consideration, and the resistance value for detection is corrected with high accuracy, and eventually the detection target current is detected with high accuracy.

Other Embodiments

The present disclosure is not limited to the embodiments that have been described above and illustrated in the drawings, but can freely be modified, combined, or expanded without departing from the gist of the present disclosure.

The numerical values and the like shown in the embodiments described above are examples, and are not limited to those examples.

The specific configuration of the signal application units 6 and 52 may not be limited to the configuration described in each of the above embodiments, and may be any configuration as long as the feature applies an AC signal to the series circuit of the shunt resistor 4 and the correction resistor 5.

The specific configuration of the first synchronous detection circuit 12 may not be limited to the configuration described in each of the above embodiments, and may be any configuration as long as the feature inputs the signal of the terminal of the shunt resistor 4 and performs synchronous detection at the same frequency as the AC signal to extract and output a signal. The specific configuration of the second synchronous detection circuit 14 may be such that the signal of the terminal of the correction resistor can be input and synchronous detection can be performed at the same frequency as the frequency of the AC signal to extract and output the signal.

Although the present disclosure has been described in accordance with the embodiments, it is understood that the present disclosure is not limited to the above embodiments or structures. The present disclosure incorporates various modifications and variations within the scope of equivalents. In addition, various combinations and forms, and further, other combinations and forms including only one element, or more or less than these elements are also within the sprit and the scope of the present disclosure.

What is claimed is:

1. A current sensor for detecting a detection target current based on a terminal voltage of a shunt resistor arranged in series in a path through which the detection target current flows and a resistance value for current detection corresponding to a resistance value of the shunt resistor, the current sensor comprising:
    a resistance value correction circuit for correcting the resistance value for current detection, wherein:
    the resistance value correction circuit includes:
        a correction resistor connected in series with the shunt resistor in a path different from the path through which the detection target current flows and having a higher resistance accuracy than the shunt resistor;
        a signal application unit that applies an alternating current signal to a series circuit of the shunt resistor and the correction resistor;
        a first voltage detection unit that detects the terminal voltage of the shunt resistor when the alternating current signal is applied to the series circuit;
        a second voltage detection unit that detects a terminal voltage of the correction resistor when the alternating current signal is applied to the series circuit; and
        a correction unit that
            calculates the resistance value of the shunt resistor based on a first voltage detection value which is a detection value of the terminal voltage by the first voltage detection unit and a second voltage detection value which is a detection value of the terminal voltage by the second voltage detection unit, and
            corrects the resistance value for current detection based on a calculated resistance value which is a calculated resistance value of the shunt resistor.

2. The current sensor according to claim 1, wherein:
the first voltage detection unit includes a first synchronous detection circuit that inputs a signal of a terminal of the shunt resistor and synchronously detects the signal at a same frequency as the alternating current signal to extract and output the signal;
the first voltage detection unit is configured to detect the terminal voltage of the shunt resistor based on an output signal of the first synchronous detection circuit;
the second voltage detection unit includes a second synchronous detection circuit that inputs a signal of a terminal of the correction resistor, synchronously detects the signal at the same frequency as the alternating current signal to extract and output the signal; and
the second voltage detection unit is configured to detect the terminal voltage of the correction resistor based on an output signal of the second synchronous detection circuit.

3. The current sensor according to claim 1, wherein:
the first voltage detection unit includes a first A/D converter that performs an A/D conversion operation for detecting the terminal voltage of the shunt resistor and the terminal voltage of the correction resistor;
the second voltage detection unit includes a second A/D converter that performs an A/D conversion operation for detecting the terminal voltage of the shunt resistor and the terminal voltage of the correction resistor; and
the resistance value correction circuit further includes:
    a switching unit that switches a connection state so that each of the first A/D converter and the second A/D converter is connected to each of the shunt resistor and the correction resistor, respectively; and
    a gain error reduction unit that reduces gain errors of the first A/D converter and the second A/D converter by switching the connection state of the switching unit.

4. The current sensor according to claim 1, wherein:
the resistance value correction circuit further includes:
    a first temperature detection unit that detects a temperature of the shunt resistor; and
    a current value correction unit that corrects a detection value of the detection target current based on a first temperature detection value, which is the temperature detected by the first temperature detection unit.

5. The current sensor according to claim 4, wherein:
the resistance value correction circuit further includes a second temperature detection unit that detects a temperature of the correction resistor; and
the current value correction unit corrects the detection value of the detection target current based on the first temperature detection value and a second temperature detection value, which is the temperature detected by the second temperature detection unit.

6. The current sensor according to claim 1, wherein:
the signal application unit applies the alternating current signal having a pulse wave or a sine wave to the series circuit.

7. A current sensor for detecting a detection target current based on a terminal voltage of a shunt resistor arranged in series in a path through which the detection target current flows and a resistance value for current detection corresponding to a resistance value of the shunt resistor, the current sensor comprising:
  a resistance value correction circuit for correcting the resistance value for current detection, wherein:
  the resistance value correction circuit includes:
    a correction resistor connected in series with the shunt resistor in a path different from the path through which the detection target current flows and having a higher resistance accuracy than the shunt resistor;
    a signal application unit that includes a transistor, a signal generator, and an OP amplifier, and applies an alternating current signal to a series circuit of the shunt resistor and the correction resistor;
    a first voltage detection unit that includes a first A/D converter and a first synchronous detector, and detects the terminal voltage of the shunt resistor when the alternating current signal is applied to the series circuit;
    a second voltage detection unit that includes a second A/D converter and a second synchronous detection circuit, and detects a terminal voltage of the correction resistor when the alternating current signal is applied to the series circuit; and
    a correction unit that includes a processor and a memory, and
      calculates the resistance value of the shunt resistor based on a first voltage detection value which is a detection value of the terminal voltage by the first voltage detection unit and a second voltage detection value which is a detection value of the terminal voltage by the second voltage detection unit, and
      corrects the resistance value for current detection based on a calculated resistance value which is a calculated resistance value of the shunt resistor.

* * * * *